United States Patent
Sakamoto et al.

(10) Patent No.: US 8,923,031 B2
(45) Date of Patent: Dec. 30, 2014

(54) SEMICONDUCTOR MEMORY DEVICE

(71) Applicant: Kabushiki Kaisha Toshiba, Tokyo (JP)

(72) Inventors: Kei Sakamoto, Nagoya (JP); Masaki Kondo, Kawasaki (JP); Nobuaki Yasutake, Yokkaichi (JP); Takayuki Okamura, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 141 days.

(21) Appl. No.: 13/778,849

(22) Filed: Feb. 27, 2013

(65) Prior Publication Data

US 2014/0003128 A1    Jan. 2, 2014

(30) Foreign Application Priority Data

Jul. 2, 2012 (JP) ................. 2012-148635

(51) Int. Cl.
*G11C 11/00* (2006.01)
*G11C 13/00* (2006.01)

(52) U.S. Cl.
CPC .......... *G11C 13/0002* (2013.01); *G11C 13/004* (2013.01); *G11C 13/0069* (2013.01); *G11C 2213/72* (2013.01)
USPC ........................ 365/148; 365/163; 365/189.09

(58) Field of Classification Search
CPC ............. G11C 13/0002; G11C 13/004; G11C 13/0069; G11C 2213/72
USPC ........ 365/148, 158, 163, 185.19, 175, 230.03
See application file for complete search history.

(56) References Cited

U.S. PATENT DOCUMENTS

| | | | |
|---|---|---|---|
| 8,040,715 B2 * | 10/2011 | Takase | 365/148 |
| 8,199,557 B2 * | 6/2012 | Maejima et al. | 365/148 |
| 8,310,858 B2 | 11/2012 | Ito | |
| 8,369,130 B2 * | 2/2013 | Maejima | 365/148 |
| 8,537,598 B2 * | 9/2013 | Maejima et al. | 365/148 |
| 2009/0059651 A1 | 3/2009 | Aoki | |
| 2011/0044090 A1 | 2/2011 | Terada et al. | |
| 2011/0069533 A1 | 3/2011 | Kurosawa et al. | |
| 2011/0128780 A1 | 6/2011 | Osada et al. | |

FOREIGN PATENT DOCUMENTS

| | | |
|---|---|---|
| JP | 2009-266312 | 11/2009 |
| JP | 2010-251479 | 11/2010 |
| JP | 2011-44193 | 3/2011 |
| JP | 2011-54232 | 3/2011 |
| WO | WO 2007/132525 A1 | 11/2007 |

* cited by examiner

*Primary Examiner* — Gene Auduong
(74) *Attorney, Agent, or Firm* — Oblon, Spivak, McClelland, Maier & Neustadt, L.L.P.

(57) ABSTRACT

A semiconductor memory device according to an embodiment includes: a memory cell array including a plurality of first lines, a plurality of second lines, and memory cells disposed at each of intersections of the first lines and the second lines; and a control circuit configured to apply a first voltage to a selected first line, apply a second voltage having a voltage value which is smaller than that of the first voltage to a selected second line, and apply a third voltage and a fourth voltage to a non-selected first line and a non-selected second line, respectively. The control circuit is configured to apply a fifth voltage to one of the non-selected first lines that is adjacent to the selected first line, and apply a sixth voltage to one of the non-selected second lines that is adjacent to the selected second line.

20 Claims, 7 Drawing Sheets

Comparative Example

SEMICONDUCTOR MEMORY DEVICE

CROSS REFERENCE TO RELATED APPLICATION

This application is based upon and claims the benefit of priority from prior Japanese Patent Application No. 2012-148635, filed on Jul. 2, 2012, the entire contents of which are incorporated herein by reference.

BACKGROUND

1. Field

Embodiments described in the present specification relate to a semiconductor memory device configured as an arrangement of memory cells each storing data by a change in resistance value of a variable resistance element.

2. Description of the Related Art

In recent years, a resistance varying memory device employing a variable resistance element as a storage element has been receiving attention as a successor candidate of flash memory. Resistance varying memory devices are assumed here to include not only resistance varying memory in a narrow sense, that is, resistance varying memory that configures a transition metal oxide as a recording layer and stores a resistance value state of the transition metal oxide in a non-volatile manner (ReRAM: Resistive RAM), but also phase change memory that employs chalcogenide or the like as a recording layer and uses resistance value information of a crystalline state (conductor) and an amorphous state (insulator) of the chalcogenide or the like (PCRAM: Phase Change RAM), and so on.

A memory cell array in a resistance varying memory device has memory cells disposed at intersections of bit lines and word lines, each memory cell being configured from a variable resistance element and a current rectifier element such as a diode or the like. In such a memory cell array, selection of a memory cell can be performed using the current rectifier element such as a diode or the like. Moreover, it is also possible for a high-density memory cell array to be realized by alternately stacking the bit lines and word lines to configure a three-dimensional stacked arrangement of memory cell arrays.

In a memory cell array having memory cells arranged at intersections of bit lines and word lines, when an operation is executed on a selected memory cell, a memory cell adjacent to the selected memory cell is sometimes affected by a voltage applied to the selected memory cell. In such a case, there is a possibility that leak current in the diode of the memory cell adjacent to the selected memory cell increases thereby causing an increase in power consumption or a faulty operation.

DETAILED DESCRIPTION

A semiconductor memory device according to an embodiment comprises: a memory cell array including a plurality of first lines disposed on a substrate, a plurality of second lines disposed intersecting the first lines, and memory cells disposed at each of intersections of the first lines and the second lines and each configured having a current rectifier element and a variable resistance element connected in series therein; and a control circuit configured to apply a first voltage to a selected first line, apply a second voltage having a voltage value which is smaller than that of the first voltage to a selected second line, and apply a third voltage and a fourth voltage to a non-selected first line and a non-selected second line, respectively, such that a first potential difference is applied to a selected memory cell in an operation on the selected memory cell disposed at the intersection of the selected first line and the selected second line. The control circuit is configured to apply a fifth voltage different to the third voltage to one of the non-selected first lines that is adjacent to the selected first line, and apply a sixth voltage different to the fourth voltage to one of the non-selected second lines that is adjacent to the selected second line.

Next, embodiments of the present invention are described in detail with reference to the drawings. Note that in the descriptions of the drawings in the embodiments below, identical symbols are assigned to places having an identical configuration, and duplicated descriptions of such places are omitted.

[Overall Configuration]

Figure 1:
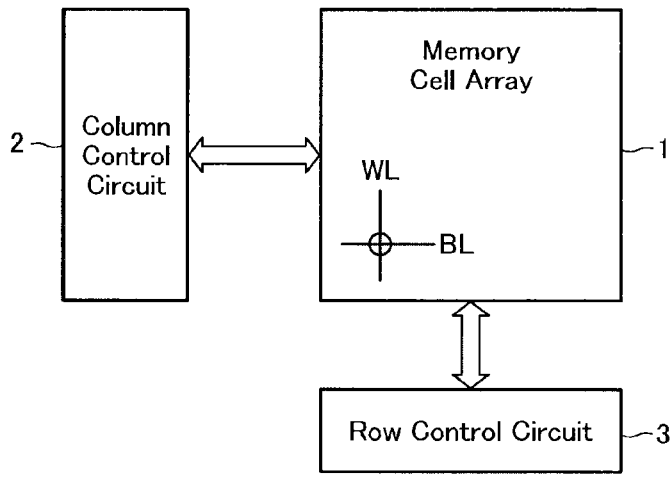
FIG. 1 is one example of a block diagram of a semiconductor memory device according to a first embodiment of the present invention.

FIG. 1 is one example of a block diagram showing a configuration of a nonvolatile memory according to a first embodiment of the present invention. This nonvolatile memory comprises a memory cell array 1 having memory cells disposed in a matrix therein, each of the memory cells using a variable resistance element VR to be described later.

Electrically connected to a bit line BL of the memory cell array 1 in order to control the bit line BL of the memory cell array 1 to perform data erase of the memory cell, data write to the memory cell, and data read from the memory cell is a column control circuit 2 for controlling a voltage of the bit line BL. Moreover, electrically connected to a word line WL of the memory cell array 1 in order to select the word line WL of the memory cell array 1 to perform data erase of the memory cell, data write to the memory cell, and data read from the memory cell is a row control circuit 3 for controlling a voltage of the word line WL.

[Memory Cell Array 1]

Figure 2:
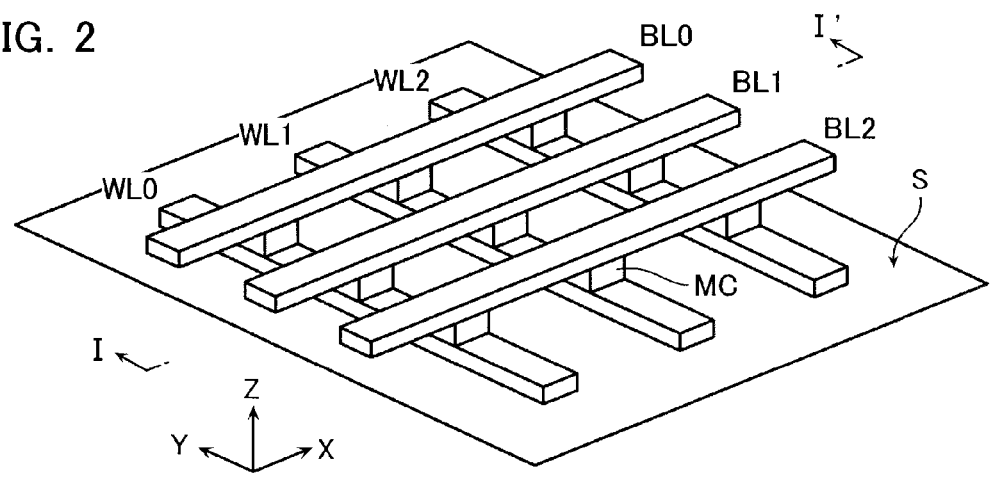
FIG. 2 is one example of a perspective view of part of a memory cell array 1.
Figure 3:
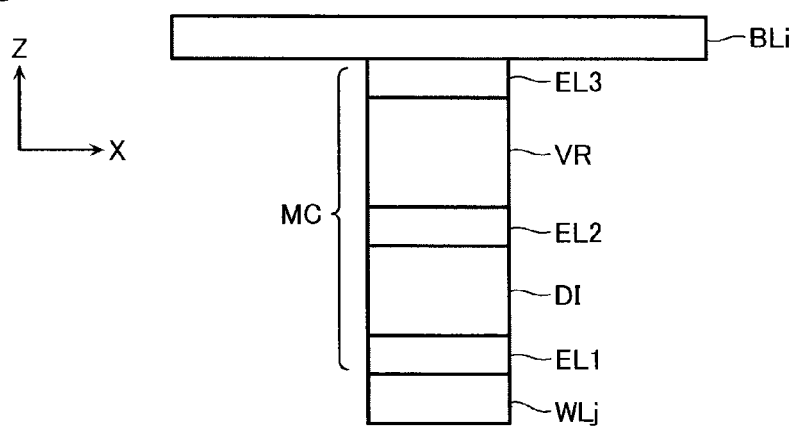
FIG. 3 is one example of a cross-sectional view taken along the line I-I' and looking in the direction of the arrows in FIG. 2, showing a single memory cell portion.

FIG. 2 is one example of a perspective view of part of the memory cell array 1, and FIG. 3 is one example of a cross-sectional view taken along the line I-I' and looking in the direction of the arrows in FIG. 2, showing a single memory cell portion. Word lines WL0~WL2 acting as a plurality of first lines are arranged in a Y direction parallel to a surface of a semiconductor substrate S. Bit lines BL0~BL2 acting as a plurality of second lines are arranged in an X direction parallel to the surface of the semiconductor substrate S so as to intersect the word lines WL. A memory cell MC is disposed at each of intersections of the word lines WL0~WL2 and the bit lines BL0~BL2 so as to be sandwiched by both lines. The first and second lines are preferably of a material which is heat-resistant and has a low resistance value. For example, W, WN, WSi, NiSi, CoSi, and so on, maybe employed as the material of the first and second lines.

[Memory Cell MC]

As shown in FIG. 3, the memory cell MC is a circuit having a variable resistance element VR and a current rectifier element, for example, a diode DI, or the like, connected in series in a Z direction perpendicular to the semiconductor substrate S. Disposed above and below the variable resistance element VR and the diode DI are electrodes EL1, EL2, and EL3 functioning as a barrier metal and an adhesive layer. The diode DI is disposed on the electrode EL1, and the electrode EL2 is disposed on the diode DI. The variable resistance element VR is disposed on the electrode EL2, and the electrode EL3 is disposed on the variable resistance element VR. Employable as an electrode material of the electrodes EL1, EL2, and EL3 is, for example, titanium nitride (TiN). Moreover, it is also possible for a different material to be adopted for each of the materials of the electrodes EL1, EL2, and EL3. For example, the following may also be employed as the material of the electrodes, namely Pt, Au, Ag, TiAlN, SrRuO, Ru, RuN, Ir, Co, Ti, TaN, LaNiO, Al, PtIrO$_x$, PtRhO$_x$, Rh, TaAlN, W, WN, TaSiN, TaSi$_2$, TiSi, TiC, TaC, Nb-TiO$_2$, NiSi, CoSi, and so on. In addition, insertion of a metal film to make orientation uniform is also possible. Moreover, inserting a separate buffer layer, barrier metal layer, adhesive layer, and so on, is also possible. Furthermore, a structure that changes an order in the Z direction of the diode DI and the variable resistance element VR is also included in embodiments of the present invention.

[Variable Resistance Element]

Employed as the variable resistance element VR is a substance capable of having its resistance value changed via an electric field, a current, heat, chemical energy, and so on, by application of a voltage. For example, the following may be employed as the variable resistance element VR, namely: an element that has its resistance value changed by a shift in phase between a crystalline state and an amorphous state in the manner of chalcogenide, or the like (PCRAM); an element that has its resistance value changed by depositing metal cations to form a contacting bridge between electrodes, and ionizing the deposited metal to destroy the contacting bridge (CBRAM); an element where the resistance value changes by application of a voltage or current (broadly divided into an element where a resistance change occurs due to presence/absence of trapped charge in a charge trap existing at an electrode interface, and an element where a resistance change occurs due to presence/absence of a conductive path resulting from oxygen deficiency, or the like) (ReRAM); and so on.

[Current Rectifier Element]

The current rectifier element employed in the memory cell MC is not specifically limited regarding a material, structure and so on, provided it is an element having a current rectifying characteristic in its voltage-current characteristics. One example of the current rectifier element is a diode DI manufactured by polysilicon (Poly-Si). Employable as the diode DI is, for example, a PIN diode having a p-type layer and an n-type layer that include impurities, and an i layer inserted between these p-type and n-type layers that does not include an impurity. Moreover, the following may also be employed as the diode DI, namely a PN junction diode comprising a p-type layer and an n-type layer, various kinds of diodes such as a Schottky diode, a punch-through diode, and so on.

[Memory Cell Array and Its Peripheral Circuits]

Figure 4:
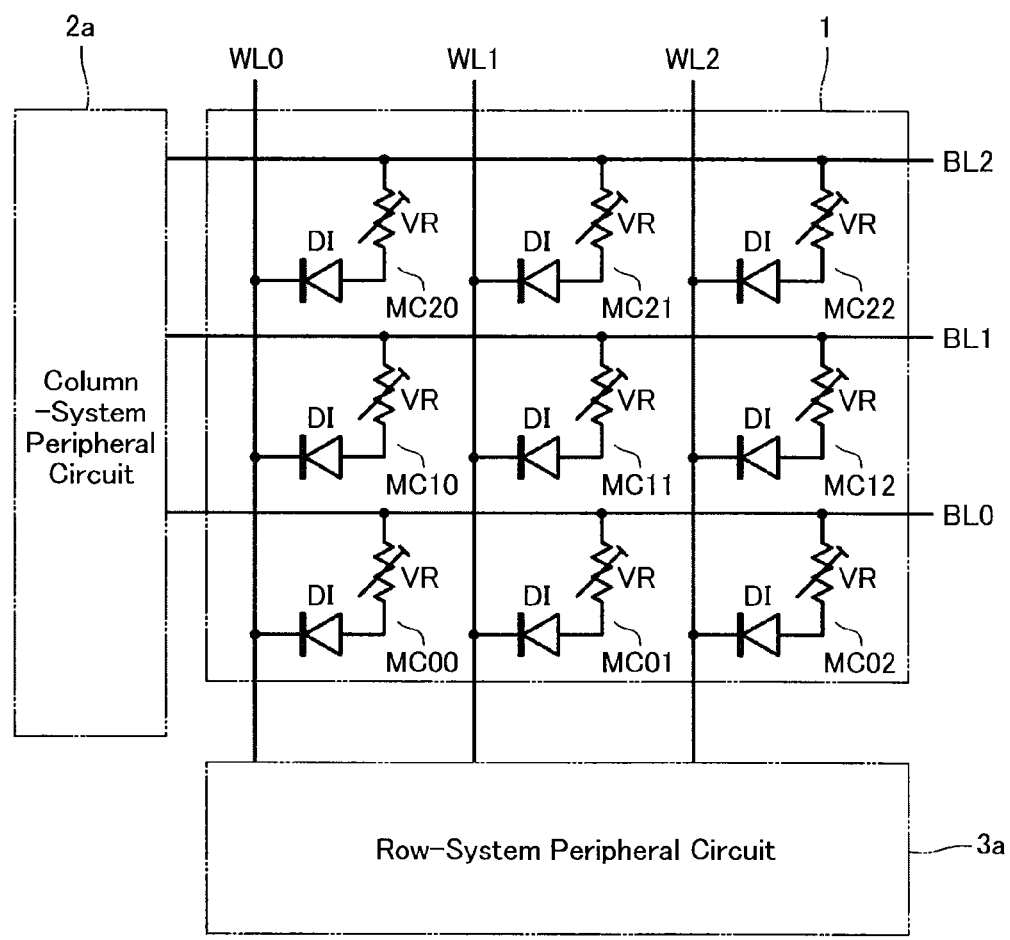
FIG. 4 is one example of a circuit diagram of the memory cell array 1 and peripheral circuits of the memory cell array 1.

FIG. 4 is one example of a circuit diagram of the memory cell array 1 and its peripheral circuits. In FIG. 4, the memory cell MC is configured by the variable resistance element VR and the diode DI. The diode DI has a current rectifying characteristic such that current flows through a selected memory cell MC from a selected bit line BL to a selected word line WL. One end of each of the bit lines BL is connected to a column-system peripheral circuit 2a which is part of the column control circuit 2. In addition, one end of each of the word lines WL is connected to a row-system peripheral circuit 3a which is part of the row control circuit 3. Voltages required in operations on the bit lines BL and the word lines WL are supplied by these column-system peripheral circuit 2a and row-system peripheral circuit 3a. The column-system peripheral circuit 2a and the row-system peripheral circuit 3a may each be appended with a different function required in operational control of the bit lines BL and the word lines WL.

[Operation in Present Embodiment]

An operation according to the present embodiment is described below with reference to FIG. 5. Write of data to the memory cell MC is performed by applying a certain voltage for a certain time to the variable resistance element VR in a selected memory cell MC. This causes the variable resistance element VR in the selected memory cell MC to change from a high-resistance state to a low-resistance state. Hereinafter, this operation for changing the variable resistance element VR from a high-resistance state to a low-resistance state is called a setting operation.

Now, the setting operation in the present embodiment is an operation that changes the variable resistance element VR from a high-resistance state to a low-resistance state by applying a setting voltage in a direction which is the reverse of a current rectifying direction of the diode DI. Hereinafter, this operation for changing the variable resistance element VR from a high-resistance state to a low-resistance state by applying a setting voltage in a direction which is the reverse of a current rectifying direction of the diode DI is called a reverse setting operation.

Figure 5:
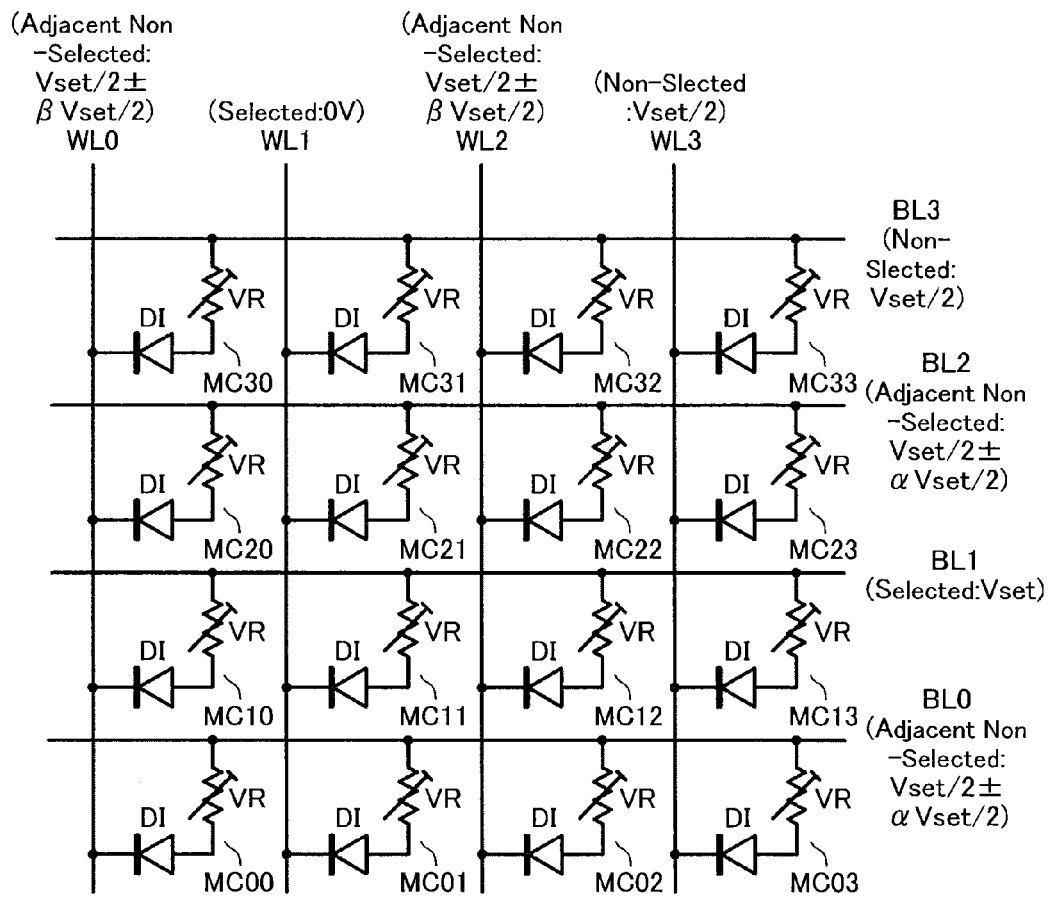
FIG. 5 is one example of a view showing a voltage application state during an operation in the first embodiment.

FIG. 5 is one example of a view showing a voltage application state during the reverse setting operation in the present embodiment. As shown in FIG. 5, during the reverse setting operation, a selected bit line BL1 is applied with a setting voltage Vset. Note that in the reverse setting operation, the setting voltage Vset is a voltage having a negative voltage value. In addition, a selected word line WL1 is applied with a voltage 0 V. As a result, a selected memory cell MC11 connected to the selected bit line BL1 and the selected word line WL1 is applied with the setting voltage Vset in a reverse direction to the current rectifying direction of the diode DI. The variable resistance element VR in the selected memory cell MC11 changes from a high-resistance state to a low-resistance state due to this setting voltage Vset.

A non-selected bit line BL3 (and bit lines BL that are numbered BL4 or higher, not illustrated) and a non-selected word line WL3 (and word lines WL that are numbered WL4 or higher, not illustrated) are applied with a voltage Vset/2.

Now, in the reverse setting operation of the present embodiment, non-selected bit lines BL0 and BL2 adjacent to the selected bit line BL1 are applied with a voltage different to the voltage Vset/2. In addition, non-selected word lines WL0 and WL2 adjacent to the selected word line WL1 are also applied with a voltage different to the voltage Vset/2. Voltages applied to the non-selected bit lines BL0 and BL2 adjacent to the selected bit line BL1 (adjacent non-selected bit lines) and the non-selected word lines WL0 and WL2 adjacent to the selected word line WL1 (adjacent non-selected word lines) are described below.

The adjacent non-selected bit lines BL0 and BL2 are applied with a voltage Vset/2±α*Vset/2 which differs from the voltage Vset/2 by an amount of a bias voltage value α*Vset/2. In addition, the adjacent non-selected word lines WL0 and WL2 are applied with a voltage Vset/2 ±β*Vset/2 which differs from the voltage Vset/2 by an amount of a bias voltage value β*Vset/2. Now, values of α and β are certain values greater than 0. The values of α and β may be identical values (α=β), or may be different values (α≠β).

[Advantages]

Figure 6:
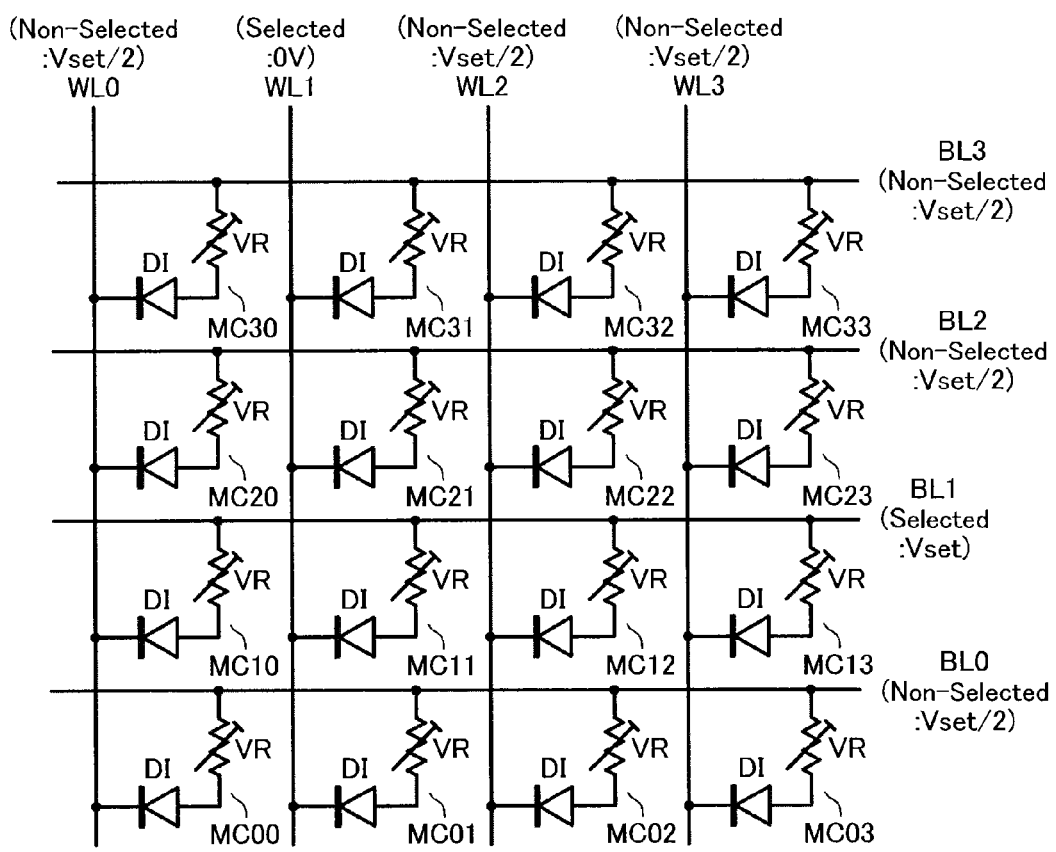
FIG. 6 is one example of a view showing a voltage application state during an operation in a comparative example.

Advantages of the reverse setting operation in the present embodiment are described below with reference to a comparative example. FIG. 6 is one example of a view showing a voltage application state during a reverse setting operation in the comparative example.

As shown in FIG. 6, likewise during the reverse setting operation in the comparative example, the selected bit line BL1 is applied with the setting voltage Vset and the selected word line WL1 is applied with the voltage 0 V. Now, during the reverse setting operation in the comparative example, all of the non-selected bit lines BL0, BL2, BL3, . . . , and all of the non-selected word lines WL0, WL2, WL3, . . . are applied with the voltage Vset/2.

During the reverse setting operation in the comparative example, memory cells MC10, MC12, MC13, . . . other than the selected memory cell MC11 that are connected to the selected bit line BL1 are applied with the voltage Vset/2 in a reverse direction to the current rectifying direction of the diode DI. Similarly, memory cells MC01, MC21, MC31, . . . other than the selected memory cell MC11 that are connected to the selected word line WL1 are also applied with the voltage Vset/2 in a reverse direction to the current rectifying direction of the diode DI.

Among the memory cells other than the selected memory cell MC11 that are connected to the selected bit line BL1 or the selected word line WL1, those memory cells MC01, MC10, MC21, and MC12 that are most closely adjacent to the selected memory cell MC11 are easily affected by a high voltage applied to the selected memory cell MC11.

In this case, there is a possibility that leak current flowing from the memory cells MC01, MC10, MC21, and MC12 in a reverse direction of the diode DI increases, resulting in a risk that power consumption increases.

Figure 7:
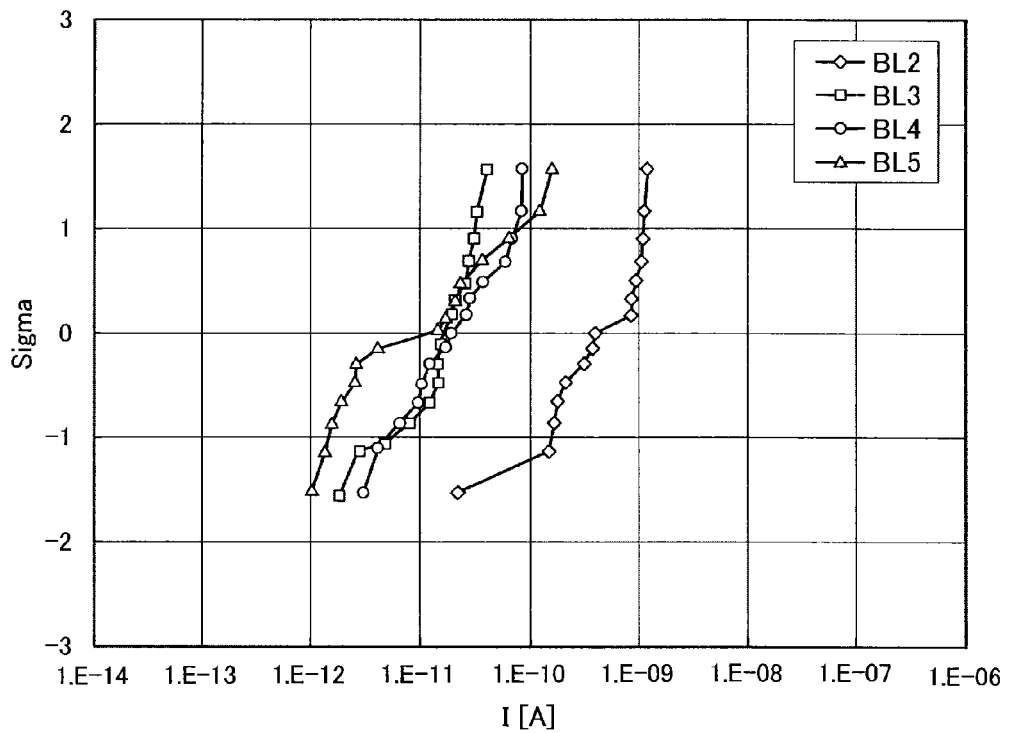
FIG. 7 is a graph showing leak current flowing in a bit line during an operation in the comparative example.

FIG. 7 is a graph showing leak current flowing in the bit lines BL during the reverse setting operation in the comparative example. FIG. 7 is a graph plotted about sigma of results of measuring current flowing in the non-selected bit lines BL2 and BL3, and bit lines BL4 and BL5 omitted in FIG. 6, when the selected bit line BL1 is applied with the setting voltage Vset.

As shown in FIG. 7, leak current in the bit line BL2 nearest to the selected bit line BL1 is an order of magnitude larger than leak current flowing in the other bit lines BL3, BL4, and BL5. This is considered to be due to a potential of the bit line BL2 adjacent to the bit line BL1 being affected by a proximity effect of the setting voltage Vset in the selected bit line BL1. There is a risk that when leak current flows from memory cells MC adjacent to a selected memory cell MC in this way, power consumption increases. Moreover, there is also a risk that a voltage of a non-selected bit line BL and a non-selected word line WL fluctuates, causing a faulty operation in a non-selected memory cell MC.

In contrast, as shown in FIG. 5, in the reverse setting operation of the present embodiment, the adjacent non-selected bit lines BL0 and BL2 and the adjacent non-selected word lines WL0 and WL2 are applied with a voltage different to that applied to the other non-selected bit lines BL and non-selected word lines WL. Next, advantages of when the adjacent non-selected bit lines BL0 and BL2 are applied with the voltage Vset/2 ±α*Vset/2 and the adjacent non-selected word lines WL0 and WL2 are applied with the voltage Vset/2±β*Vset/2 are described.

Figure 8:
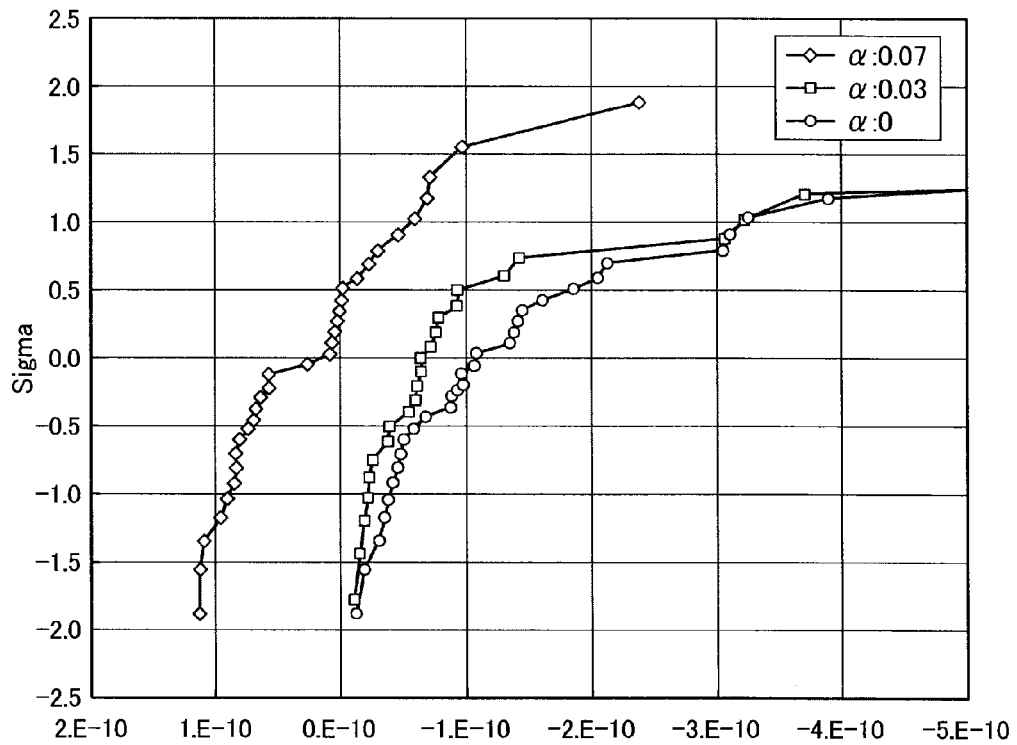
FIG. 8 is a graph showing leak current flowing in a bit line during an operation in the first embodiment.

FIG. 8 is a graph showing leak current flowing in the adjacent non-selected bit line BL2 during the reverse setting operation in the present embodiment. FIG. 8 is a graph plotted about sigma of results of measuring current flowing in the adjacent non-selected bit line BL2 when a value of the voltage Vset/2±α*Vset/2 applied to the adjacent non-selected bit lines BL0 and BL2 is changed. Note that when α=0, there is a voltage application state similar to that of the comparative example shown in FIG. 6. As shown in FIG. 8, when the value of α is increased, leak current flowing in the adjacent non-selected bit line BL2 approaches zero. That is, leak current flowing in the adjacent non-selected bit line BL2 is decreased.

In the reverse setting operation of the present embodiment, applying the voltage Vset/2±α*Vset/2 to the adjacent non-selected bit lines BL0 and BL2 in this way enables leak current flowing from the selected word line WL1 into the adjacent non-selected bit lines BL0 and BL2 via the memory cells MC01 and MC21 to be reduced. Similarly, applying the voltage Vset/2±β*Vset/2 to the adjacent non-selected word lines WL0 and WL2 enables leak current flowing from the adjacent non-selected word lines WL0 and WL2 into the selected bit line BL1 via the memory cells MC10 and MC12 to be reduced.

In the semiconductor memory device of the present embodiment, reducing leak current from memory cells MC adjacent to a selected memory cell MC allows power consumption to be reduced. In addition, fluctuation of voltage in non-selected bit lines BL and non-selected word lines WL can be suppressed, and a faulty operation of non-selected memory cells MC can also be prevented. Furthermore, since leak current mediated by the non-selected bit lines BL or non-selected word lines WL is reduced, there is no fluctuation of voltage in the selected bit line BL1 and the selected word line WL1, thereby enabling speed of the reverse setting operation to be raised based on accurate voltage application.

Note that the values of α and β in the present embodiment are preferably greater than zero and not more than 0.2. This is because when the values of α and β are zero, no advantage can be obtained, and when the values of α and β are greater than 0.2, there is a possibility that leak current increases between the adjacent non-selected bit lines BL and adjacent non-selected word lines WL and the other non-selected bit lines BL and non-selected word lines WL. Moreover, a different voltage may be applied to each of the two adjacent non-selected bit lines BL, and a different voltage may be applied to each of the two adjacent non-selected word lines WL.

In addition, values of the bias voltage values α*Vset/2 and β*Vset/2 may be added, or may be subtracted. This is because adjustment of addition/subtraction of the bias voltage values α*Vset/2 and β*Vset/2 that enable leak current flowing in the non-selected bit lines BL and non-selected word lines WL to be reduced changes depending on a scale of the memory cell array 1. The values of the bias voltage values α*Vset/2 and β*Vset/2, adjustment of addition/subtraction of these values, and so on, are determined so as to minimize power consumption of the entire array configured from the selected bit line BL1 and selected word line WL1 and the non-selected bit lines BL and non-selected word lines WL, and so on. The values of the bias voltage values α*Vset/2 and β*Vset/2, adjustment of addition/subtraction of these values, and so on, may be determined by performing an actual experiment, or may be determined by predicting by a simulation.

[Second Embodiment]

Next, a second embodiment of the present invention is described with reference to FIG. 9. An overall configuration of the semiconductor memory device in the present embodiment is similar to that in the first embodiment, hence a detailed description of the overall configuration is omitted. Moreover, places having configurations similar to those in the first embodiment are assigned with symbols identical to those assigned in the first embodiment and a duplicated description of such places is omitted. The above-described first embodiment described a setting operation for changing a variable resistance element VR in a selected memory cell MC from a high-resistance state to a low-resistance state. The second embodiment below describes an operation for changing a variable resistance element VR in a selected memory cell MC from a low-resistance state to a high-resistance state.

[Operation in Present Embodiment]

Figure 9:
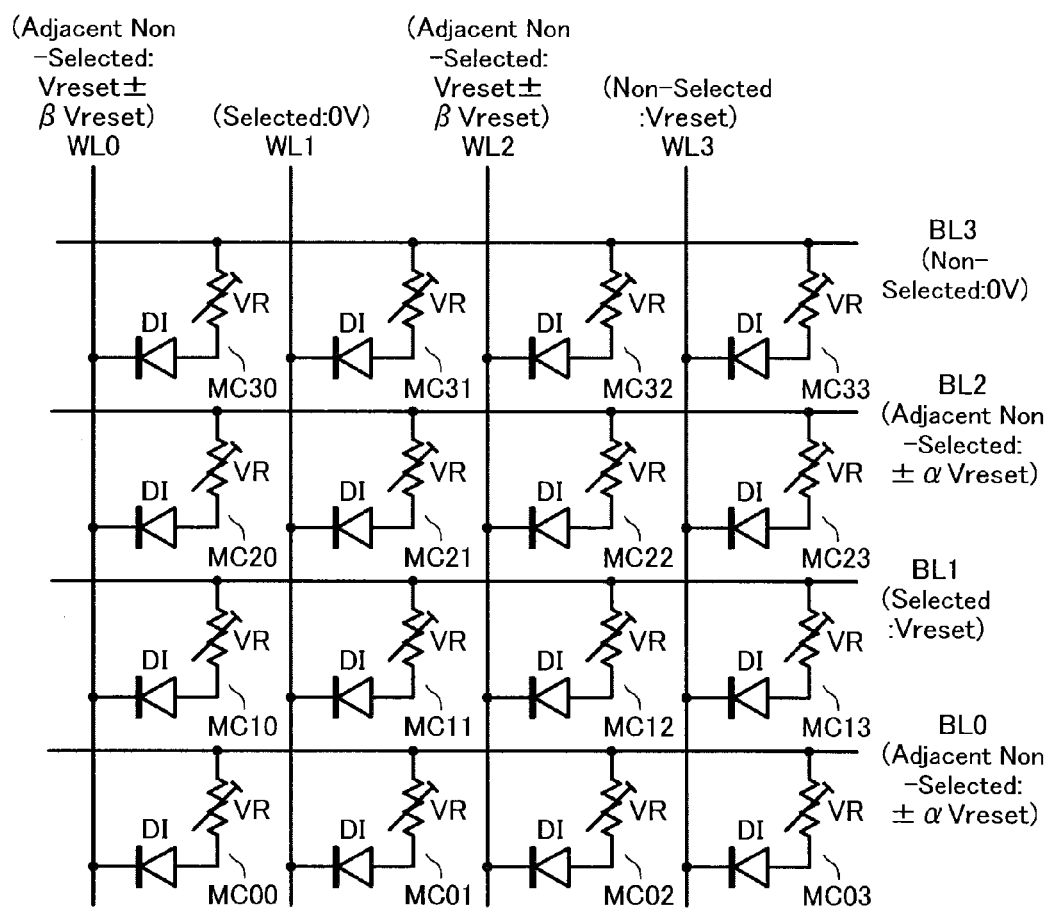
FIG. 9 is one example of a view showing a voltage application state during an operation in a second embodiment.

FIG. 9 is one example of a view showing a voltage application state during a resetting operation in the present embodiment. Erase of data in a memory cell MC is performed by applying a certain voltage in a certain direction for a certain time to a variable resistance element VR in a low-resistance state after a setting operation. This causes the variable resistance element VR to change from a low-resistance state to a high-resistance state. Hereinafter, this operation for changing the variable resistance element VR from a low-resistance state to a high-resistance state is called a resetting operation. Now, the resetting operation in the present embodiment is an operation that changes the variable resistance element VR from a low-resistance state to a high-resistance state by applying a resetting voltage in the same direction as a current rectifying direction of a diode DI.

FIG. 9 is one example of a view showing the voltage application state during the resetting operation in the present embodiment. As shown in FIG. 9, during the resetting operation, a selected bit line BL1 is applied with a resetting voltage Vreset. Note that in the resetting operation, the resetting voltage Vreset is a voltage having a positive voltage value. In addition, a selected word line WL1 is applied with a voltage 0 V. As a result, a selected memory cell MC11 connected to the selected bit line BL1 and the selected word line WL1 is applied with the resetting voltage Vreset in the same direction as the current rectifying direction of the diode DI. The variable resistance element VR in the selected memory cell MC11 changes from a low-resistance state to a high-resistance state due to this resetting voltage Vreset.

A non-selected bit line BL3 (and bit lines BL that are numbered BL4 or higher, not illustrated) is applied with a voltage 0 V. Moreover, a non-selected word line WL3 (and word lines WL that are numbered WL4 or higher, not illustrated) is applied with the voltage Vreset.

Now, in the resetting operation of the present embodiment, adjacent non-selected bit lines BL0 and BL2 are applied with a voltage different to the voltage 0 V. In addition, adjacent non-selected word lines WL0 and WL2 are also applied with a voltage different to the voltage Vreset. The adjacent non-selected bit lines BL0 and BL2 are applied with a voltage $\pm\alpha*$Vreset which differs from the voltage 0 V by an amount of a bias voltage value $\alpha*$Vreset. In addition, the adjacent non-selected word lines WL0 and WL2 are applied with a voltage Vreset $\pm\beta*$Vreset which differs from the voltage Vreset by an amount of a bias voltage value $\beta*$Vreset. Now, values of $\alpha$ and $\beta$ may be identical values, or may be different values.

[Advantages]

As shown in FIG. 9, in the resetting operation of the present embodiment, the adjacent non-selected bit lines BL0 and BL2 and the adjacent non-selected word lines WL0 and WL2 are applied with a voltage different to that applied to the other non-selected bit lines BL and non-selected word lines WL. Similarly to in the above-described first embodiment, applying the voltage $\pm\alpha*$Vreset to the adjacent non-selected bit lines BL0 and BL2 during the resetting operation enables leak current flowing from the selected word line WL1 into the adjacent non-selected bit lines BL0 and BL2 via the memory cells MC01 and MC21 to be reduced. Similarly, applying the voltage Vreset $\pm\beta*$Vreset to the adjacent non-selected word lines WL0 and WL2 enables leak current flowing from the adjacent non-selected word lines WL0 and WL2 into the selected bit line BL1 via the memory cells MC10 and MC12 to be reduced.

In the semiconductor memory device of the present embodiment, reducing leak current from memory cells MC adjacent to a selected memory cell MC allows power consumption to be reduced. In addition, fluctuation of voltage in non-selected bit lines BL and non-selected word lines WL can be suppressed, and a faulty operation of non-selected memory cells MC can also be prevented. Furthermore, since leak current mediated by the non-selected bit lines BL or non-selected word lines WL is reduced, there is no fluctuation of voltage in the selected bit line BL1 and the selected word line WL1, thereby enabling speed of the resetting operation to be raised based on accurate voltage application.

[Third Embodiment]

Next, a third embodiment of the present invention is described with reference to FIG. 10. An overall configuration of the semiconductor memory device in the present embodiment is similar to that in the first embodiment, hence a detailed description of the overall configuration is omitted. Moreover, places having configurations similar to those in the first embodiment are assigned with symbols identical to those assigned in the first embodiment and a duplicated description of such places is omitted. The above-described first and second embodiments described operations for changing a resistance state of a variable resistance element VR in a selected memory cell MC. The third embodiment below describes an operation for reading a resistance state of a variable resistance element VR in a selected memory cell MC.

[Operation in Present Embodiment]

Figure 10:
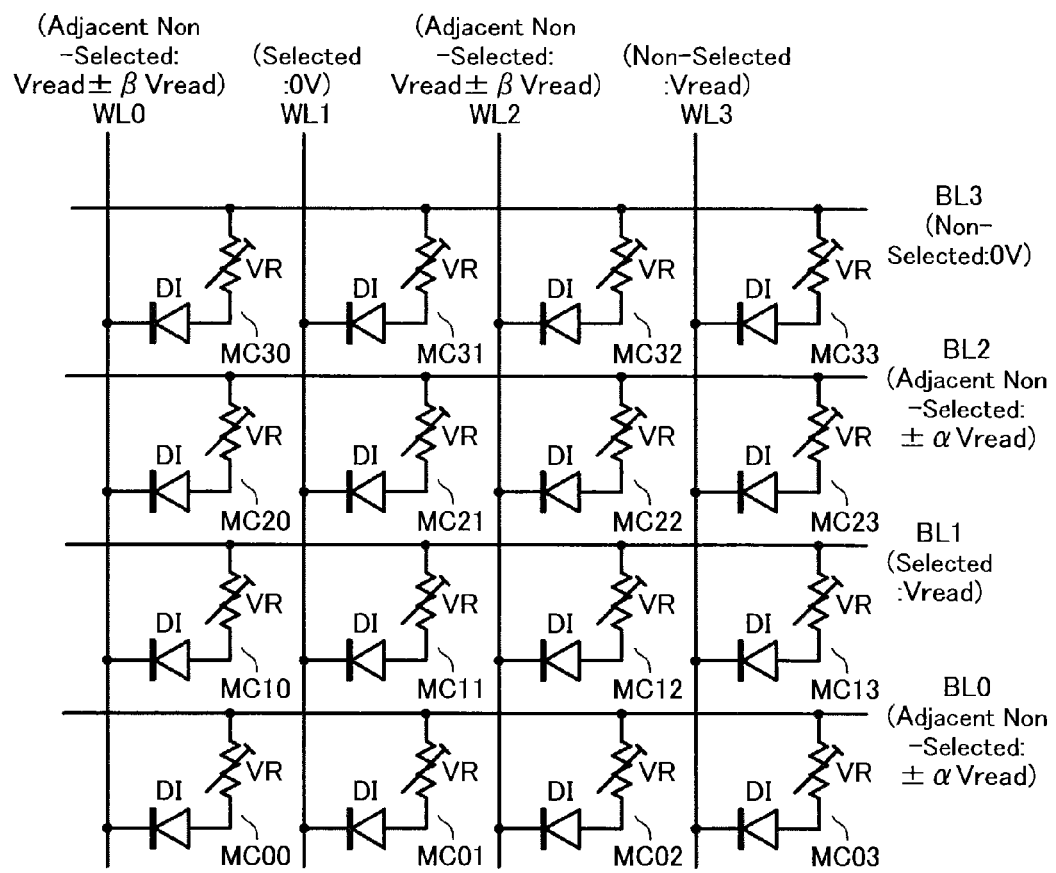
FIG. 10 is one example of a view showing a voltage application state during an operation in a third embodiment.

FIG. 10 is one example of a view showing a voltage application state during a read operation in the present embodiment. Read of data from a memory cell MC is performed by applying a certain voltage from a selected bit line BL. At this time, current flowing from the selected bit line BL into a selected word line WL via a selected memory cell MC is detected by a sense amplifier provided in the column control circuit 2 to thereby read whether a variable resistance element VR in the selected memory cell MC is in a high-resistance state or is in a low-resistance state.

FIG. 10 is one example of a view showing the voltage application state during the read operation in the present embodiment. As shown in FIG. 10, during the read operation, a selected bit line BL1 is applied with a read voltage Vread. Note that in the read operation, the read voltage Vread is a voltage having a positive voltage value. In addition, a selected word line WL1 is applied with a voltage 0 V. As a result, a selected memory cell MC11 connected to the selected bit line BL1 and the selected word line WL1 is applied with the read voltage Vread in the same direction as a current rectifying direction of a diode DI. At this time, current flowing from the selected bit line BL1 into the selected word line WL1 via the selected memory cell MC11 is detected by the sense amplifier provided in the column control circuit 2. If current flowing within the selected memory cell MC11 is larger than a certain judgment value, the variable resistance element VR in the selected memory cell MC11 is judged to be in a low-resistance state. On the other hand, if current flowing within the selected memory cell MC11 is no larger than the certain judgment value, the variable resistance element VR in the selected memory cell MC11 is judged to be in a high-resistance state.

A non-selected bit line BL3 (and bit lines BL that are numbered BL4 or higher, not illustrated) is applied with a voltage 0 V. Moreover, a non-selected word line WL3 (and word lines WL that are numbered WL4 or higher, not illustrated) is applied with the voltage Vread.

Now, in the read operation of the present embodiment, adjacent non-selected bit lines BL0 and BL2 are applied with a voltage different to the voltage 0 V. In addition, adjacent non-selected word lines WL0 and WL2 are also applied with a voltage different to the voltage Vread. The adjacent non-selected bit lines BL0 and BL2 are applied with a voltage $\pm\alpha*$Vread which differs from the voltage 0 V by an amount of a bias voltage value $\alpha*$Vread. In addition, the adjacent non-selected word lines WL0 and WL2 are applied with a voltage Vread $\pm\beta*$Vread which differs from the voltage Vread by an amount of a bias voltage value $\beta*$Vread. Now, values of $\alpha$ and $\beta$ may be identical values, or may be different values.

[Advantages]

As shown in FIG. 10, in the read operation of the present embodiment, the adjacent non-selected bit lines BL0 and BL2 and the adjacent non-selected word lines WL0 and WL2 are applied with a voltage different to that applied to the other non-selected bit lines BL and non-selected word lines WL. Similarly to in the above-described embodiments, applying the voltage $\pm\alpha*$Vread to the adjacent non-selected bit lines BL0 and BL2 during the read operation enables leak current flowing from the selected word line WL1 into the adjacent non-selected bit lines BL0 and BL2 via the memory cells MC01 and MC21 to be reduced. Similarly, applying the voltage Vread $\pm\beta*$Vread to the adjacent non-selected word lines WL0 and WL2 enables leak current flowing from the adjacent non-selected word lines WL0 and WL2 into the selected bit line BL1 via the memory cells MC10 and MC12 to be reduced.

In the semiconductor memory device of the present embodiment, reducing leak current from memory cells MC adjacent to a selected memory cell MC allows power consumption to be reduced. In addition, fluctuation of voltage in non-selected bit lines BL and non-selected word lines WL can be suppressed, and a faulty operation of non-selected memory cells MC can also be prevented. Furthermore, since leak current mediated by the non-selected bit lines BL or non-selected word lines WL is reduced, there is no fluctuation of voltage in the selected bit line BL1 and the selected word line WL1, thereby enabling speed of the read operation to be raised based on accurate voltage application.

While certain embodiments have been described, these embodiments have been presented byway of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell array including a plurality of first lines disposed on a substrate, a plurality of second lines disposed intersecting the first lines, and memory cells disposed at each of intersections of the first lines and the second lines and each configured having a current rectifier element and a variable resistance element connected in series therein; and
a control circuit configured to apply a first voltage to a selected first line, apply a second voltage having a voltage value which is smaller than that of the first voltage to a selected second line, and apply a third voltage and a fourth voltage to a non-selected first line and a non-selected second line, respectively, such that a first potential difference is applied to a selected memory cell in an operation on the selected memory cell disposed at the intersection of the selected first line and the selected second line,
the control circuit being configured to apply a fifth voltage different to the third voltage to one of the non-selected first lines that is adjacent to the selected first line, and apply a sixth voltage different to the fourth voltage to one of the non-selected second lines that is adjacent to the selected second line.

2. The semiconductor memory device according to claim 1, wherein
the control circuit is configured to apply the first potential difference in a reverse direction to a current rectifying direction of the current rectifier element, and
the variable resistance element changes from a high-resistance state to a low-resistance state by the first potential difference.

3. The semiconductor memory device according to claim 2, wherein
the third voltage and the fourth voltage have an identical value.

4. The semiconductor memory device according to claim 3, wherein
the second voltage is a negative voltage.

5. The semiconductor memory device according to claim 4, wherein
the third voltage and the fourth voltage have a value which is half that of the second voltage.

6. The semiconductor memory device according to claim 1, wherein
the control circuit is configured to apply the first potential difference in the same direction as a current rectifying direction of the current rectifier element, and
the variable resistance element changes from a low-resistance state to a high-resistance state by the first potential difference.

7. The semiconductor memory device according to claim 1, wherein
the control circuit is configured to apply the first potential difference in the same direction as a current rectifying direction of the current rectifier element and is configured capable of detecting a resistance state of the variable resistance element based on a current flowing in the memory cell.

8. The semiconductor memory device according to claim 1, wherein
the fifth voltage is different to the third voltage by an amount of a first bias voltage value,
the sixth voltage is different to the fourth voltage by an amount of a second bias voltage value, and the first bias voltage value and the second bias voltage value are an identical value.

9. A semiconductor memory device, comprising:
a memory cell array including a plurality of first lines disposed on a substrate, a plurality of second lines disposed intersecting the first lines, and memory cells disposed at each of intersections of the first lines and the second lines and each configured having a current rectifier element and a variable resistance element connected in series therein; and
a control circuit configured to apply a first voltage to a selected first line, apply a second voltage having a voltage value which is smaller than that of the first voltage to a selected second line, and apply a third voltage and a fourth voltage to a non-selected first line and a non-selected second line, respectively, such that a first potential difference is applied to a selected memory cell in an operation on the selected memory cell disposed at the intersection of the selected first line and the selected second line,
the control circuit being configured to apply a fifth voltage different to the third voltage to one of the non-selected first lines that is adjacent to the selected first line, and apply a sixth voltage different to the fourth voltage to one of the non-selected second lines that is adjacent to the selected second line,
the fifth voltage being in a range between a value which is that of a first bias voltage added to the third voltage and a value which is that of the first bias voltage subtracted from the third voltage, and
the sixth voltage being in a range between a value which is that of a second bias voltage added to the fourth voltage and a value which is that of the second bias voltage subtracted from the fourth voltage.

10. The semiconductor memory device according to claim 9, wherein
the control circuit is configured to apply the first potential difference in a reverse direction to a current rectifying direction of the current rectifier element, and
the variable resistance element changes from a high-resistance state to a low-resistance state by the first potential difference.

11. The semiconductor memory device according to claim 10, wherein
the third voltage and the fourth voltage have an identical value.

12. The semiconductor memory device according to claim 11, wherein
the second voltage is a negative voltage.

13. The semiconductor memory device according to claim 12, wherein
the third voltage and the fourth voltage have a value which is half that of the second voltage.

14. The semiconductor memory device according to claim 9, wherein
the control circuit is configured to apply the first potential difference in the same direction as a current rectifying direction of the current rectifier element, and
the variable resistance element changes from a low-resistance state to a high-resistance state by the first potential difference.

15. The semiconductor memory device according to claim 9, wherein
the control circuit is configured to apply the first potential difference in the same direction as a current rectifying direction of the current rectifier element and is configured capable of detecting a resistance state of the variable resistance element based on a current flowing in the memory cell.

16. The semiconductor memory device according to claim 9, wherein
the first bias voltage value and the second bias voltage value are an identical value.

17. A semiconductor memory device, comprising:
a memory cell array including a plurality of first lines disposed on a substrate, a plurality of second lines disposed intersecting the first lines, and memory cells disposed at each of intersections of the first lines and the second lines and each configured having a current rectifier element and a variable resistance element connected in series therein; and
a control circuit configured to apply a first voltage to a selected first line, apply a second voltage having a voltage value which is smaller than that of the first voltage to a selected second line, and apply the second voltage and the first voltage to a non-selected first line and a non-selected second line, respectively, such that a first potential difference is applied to a selected memory cell in an operation on the selected memory cell disposed at the intersection of the selected first line and the selected second line,
the control circuit being configured to apply a third voltage different to the second voltage by an amount of a first bias voltage value, to one of the non-selected first lines that is adjacent to the selected first line, and apply a fourth voltage different to the first voltage by an amount of a second bias voltage value, to one of the non-selected second lines that is adjacent to the selected second line.

18. The semiconductor memory device according to claim 17, wherein
the control circuit is configured to apply the first potential difference in the same direction as a current rectifying direction of the current rectifier element, and
the variable resistance element changes from a low-resistance state to a high-resistance state by the first potential difference.

19. The semiconductor memory device according to claim 17, wherein
the control circuit is configured to apply the first potential difference in the same direction as a current rectifying direction of the current rectifier element and is configured capable of detecting a resistance state of the variable resistance element based on a current flowing in the memory cell.

20. The semiconductor memory device according to claim 17, wherein
the first bias voltage value and the second bias voltage value are an identical value.

* * * * *